US011616101B2

(12) United States Patent
Lee et al.

(10) Patent No.: US 11,616,101 B2
(45) Date of Patent: Mar. 28, 2023

(54) DISPLAY DEVICE HAVING OPTICAL AUXILIARY LAYER AND METHOD OF MANUFACTURING THE SAME

(71) Applicant: Samsung Display Co., Ltd., Yongin-si (KR)

(72) Inventors: Gak Seok Lee, Hwaseong-si (KR); Keunchan Oh, Hwaseong-si (KR); Byung-Chul Kim, Yongin-si (KR); Jang Wi Ryu, Yongin-si (KR); Inseok Song, Pocheon-si (KR); Halim Ji, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 124 days.

(21) Appl. No.: 17/087,157

(22) Filed: Nov. 2, 2020

(65) Prior Publication Data

US 2021/0327963 A1    Oct. 21, 2021

(30) Foreign Application Priority Data

Apr. 21, 2020    (KR) .......................... 10-2020-0048057

(51) Int. Cl.
*H01L 27/32*    (2006.01)
*G02B 5/20*    (2006.01)
*H01L 51/52*    (2006.01)

(52) U.S. Cl.
CPC ............ *H01L 27/322* (2013.01); *G02B 5/201* (2013.01); *H01L 51/5281* (2013.01)

(58) Field of Classification Search
CPC .... H01L 27/322; H01L 51/5281; G02B 5/201
See application file for complete search history.

(56) References Cited

U.S. PATENT DOCUMENTS 10,411,224 B2    9/2019 Heo et al.
10,903,442 B2 *  1/2021 Lee ..................... H01L 51/5048
(Continued)

FOREIGN PATENT DOCUMENTS

KR    10-2019-0073001    6/2019
KR    10-2019-0103551    9/2019
KR    10-2019-0130697    11/2019

OTHER PUBLICATIONS

Tian-Song Deng et al. "Synthesis of Monodisperse Polysterene@Vinyl-SiO2 Core-Shell Particles and Hollow SiO2 Spheres", American Chemical Society, https://pubs.acs.org/sjaringguidelines, 2014, vol. 24, pp. 536-542.

(Continued)

*Primary Examiner* — Tracie Y Green
(74) *Attorney, Agent, or Firm* — H.C. Park & Associates, PLC

(57) ABSTRACT

A display device includes: a substrate; a color filter layer disposed below the substrate; a color control layer disposed below the color filter layer; and an optical auxiliary layer disposed between the substrate and the color filter layer and having a base portion and a plurality of recess portions, the plurality of recess portion defined in the base portion and recessed in a direction toward the substrate, wherein an average refractive index of the optical auxiliary layer is greater than or equal to an average refractive index of the substrate and is less than or equal to an average refractive index of the color filter layer.

20 Claims, 6 Drawing Sheets

(56) References Cited

U.S. PATENT DOCUMENTS

| | | | |
|---|---|---|---|
| 10,903,446 B2* | 1/2021 | Son | H01L 27/3211 |
| 11,362,309 B2* | 6/2022 | Chung | H01L 51/5253 |
| 2016/0133880 A1* | 5/2016 | Lee | H01L 51/5234 |
| | | | 257/40 |
| 2018/0267210 A1 | 9/2018 | Takeuchi et al. | |
| 2018/0269428 A1* | 9/2018 | Uchida | H05B 33/24 |
| 2019/0067379 A1* | 2/2019 | Uchida | H01L 51/56 |
| 2019/0185743 A1 | 6/2019 | Kim et al. | |
| 2019/0265390 A1* | 8/2019 | Lim | G02F 1/133502 |
| 2019/0348470 A1* | 11/2019 | Song | H01L 51/5268 |
| 2020/0373359 A1* | 11/2020 | Lee | H01L 51/5271 |
| 2021/0384262 A1* | 12/2021 | Jin | H01L 51/5275 |

OTHER PUBLICATIONS

Marina N. Gorsd, et al., "Synthesis and Characterization of Hollow Silica Spheres", International Congress of Science and Technology of Metallurgy and Materials, SAM-CONAMET 203, www.sciencedirect.com, Procedia Material Science, 8, 2015, pp. 567-576.

* cited by examiner

DISPLAY DEVICE HAVING OPTICAL AUXILIARY LAYER AND METHOD OF MANUFACTURING THE SAME

CROSS-REFERENCE TO RELATED APPLICATION

This application claims priority from and the benefit of Korean Patent Application No. 10-2020-0048057, filed on Apr. 21, 2020, which is hereby incorporated by reference for all purposes as if fully set forth herein.

BACKGROUND

Field

Exemplary implementations of the invention relate generally to a display device and a method of manufacturing same, and more specifically, to a display device including an optical auxiliary layer and a method of manufacturing same.

Discussion of the Background

In multimedia apparatuses such as televisions, mobile phones, tablet computers, navigation devices, game consoles, and the like, various electronic devices for providing image information have been developed. Particularly, in an electronic device including a liquid crystal display element, an organic electroluminescence display element, and the like, quantum dots have been utilized to improve display quality.

Also, a method of improving reflectance has been researched so that such an electronic device has the improved reflectance characteristics while having favorable efficiency.

The above information disclosed in this Background section is only for understanding of the background of the inventive concepts, and, therefore, it may contain information that does not constitute prior art.

SUMMARY

Applicant has been realized that a display device has specular components (e.g., specular reflections or regular reflections) including reflection occurring on an interface between a substrate including glass and an air layer, reflection occurring on an interface between a substrate including glass and a color filter layer, and reflection occurring on an interface between a color filter portion and a light blocking portion. Thus, the specular components may degrade reflectance characteristics of the display device such that the display device has lower display quality.

Display devices constructed according to the principles and exemplary implementations of the invention have high display quality by providing an optical auxiliary layer therein to improve reflectance characteristics thereof.

Methods of manufacturing the display devices according to the principles and exemplary of the invention are capable of improving reflectance characteristics by reducing the specular components (e.g., specular reflections or regular reflections) through providing an optical auxiliary layer between a substrate and a color filter layer of the display devices.

According to an aspect of the invention, a display device includes: a substrate; a color filter layer disposed below the substrate; a color control layer disposed below the color filter layer; and an optical auxiliary layer disposed between the substrate and the color filter layer and having a base portion and a plurality of recess portions, the plurality of recess portion defined in the base portion and recessed in a direction toward the substrate, wherein an average refractive index of the optical auxiliary layer is greater than or equal to an average refractive index of the substrate and is less than or equal to an average refractive index of the color filter layer.

Each of the recess portions may include: an outer portion; and a core portion defined by the outer portion and filled with a same material as the color filter layer.

The core portion of each of the recess portions may include at least one of pigment and dye included in the color filter layer.

Each of the recess portions may have a recessed round shape, and an average diameter of the recess portions is about 200 nm to about 500 nm.

Each of the recess portions may be formed from at least one of a hollow silica particle, a polymer having a cavity, and a porogen.

The color filter layer may include: a first color filter portion configured to transmit a first light; a second color filter portion configured to transmit a second light different from the first light; a third color filter portion configured to transmit a third light different from the first light and the second light; and light blocking portions disposed between the first color filter portion and the second color filter portion and between the second color filter portion and the third color filter portion, wherein each of the recess portions may include a same material as at least one of the first color filter portion, the second color filter portion, the third color filter portion, and the light blocking portions.

The optical auxiliary layer may include a plurality of sub-optical auxiliary layers, and each of the sub-optical auxiliary layers may include the base portion and the recess portions.

The base portion may include at least one of acrylate resin, epoxy resin, and cardo resin.

A difference between an average refractive index of the base portion and the average refractive index of the substrate may be about 0 to about 0.2.

The average refractive index of the substrate may be about 1.4 to about 1.5, and the average refractive index of the base portion may be about 1.4 to about 1.6.

A thickness of the optical auxiliary layer may be about 500 nm to about 2000 nm.

According to another aspect of the invention, a method of manufacturing a display device includes the steps of: providing a resin layer on a substrate, the resin layer including a base resin and a plurality of nanoparticles dispersed in the base resin; forming a preliminary optical auxiliary layer including recess portions formed by etching the resin layer to remove a portion of the nanoparticles; forming a color filter layer by providing a color filter layer material on the preliminary optical auxiliary layer; and forming a color control layer on the color filter layer, the color control layer including a plurality of quantum dots, wherein the step of forming of the color filter layer includes the step of forming an optical auxiliary layer by filling the recess portions with the color filter layer material.

An average refractive index of the optical auxiliary layer may be greater than or equal to an average refractive index of the substrate and may be less than or equal to an average refractive index of the color filter layer.

Each of the nanoparticles may be at least one of a hollow silica particle, a polymer having a cavity, and a porogen.

The nanoparticles may be a plurality of porogens, and the porogens may have an amount of about 50 wt % to about 90 wt % in a total weight of the base resin and the porogens.

Each of the nanoparticles may have a spherical shape or an elliptical shape, and an average diameter of the nanoparticles may be about 200 nm to about 500 nm.

The preliminary optical auxiliary layer may include a plurality of preliminary sub-optical auxiliary layers, and each of the preliminary sub-optical auxiliary layers may include the base resin and the recess portions.

The base resin may include at least one of acrylate resin, epoxy resin, and cardo resin.

A difference between a refractive index of the base resin and a refractive index of the substrate may be about 0 to about 0.2.

The refractive index of the substrate may be about 1.4 to about 1.5, and

The refractive index of the base resin may be about 1.4 to about 1.6.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
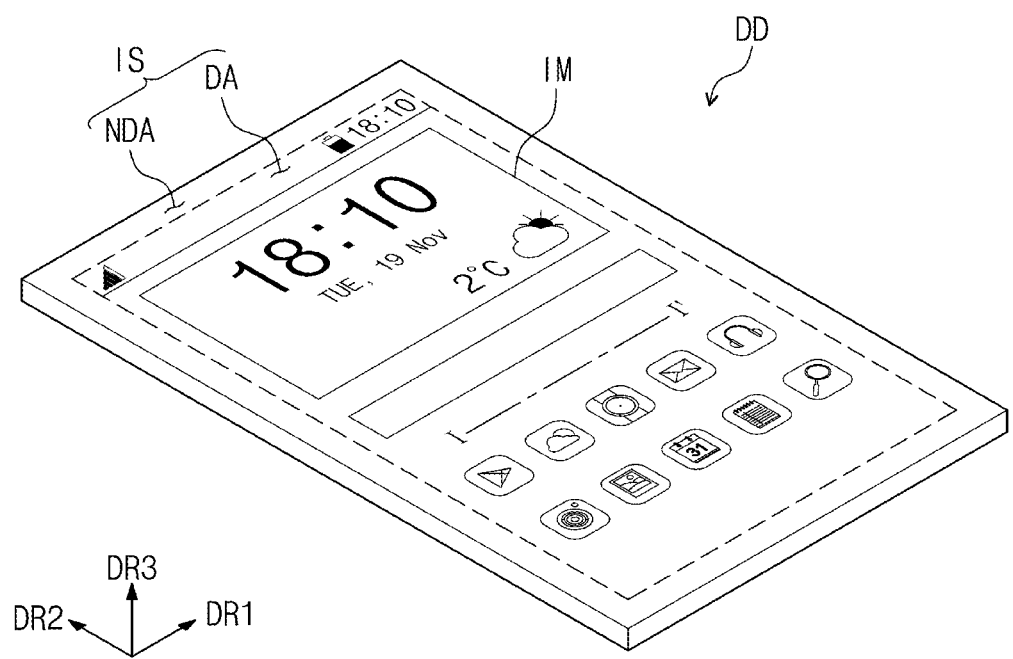
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z—axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an exemplary embodiment and a method of manufacturing the display device will be described with reference to the drawings.

Figure 2:
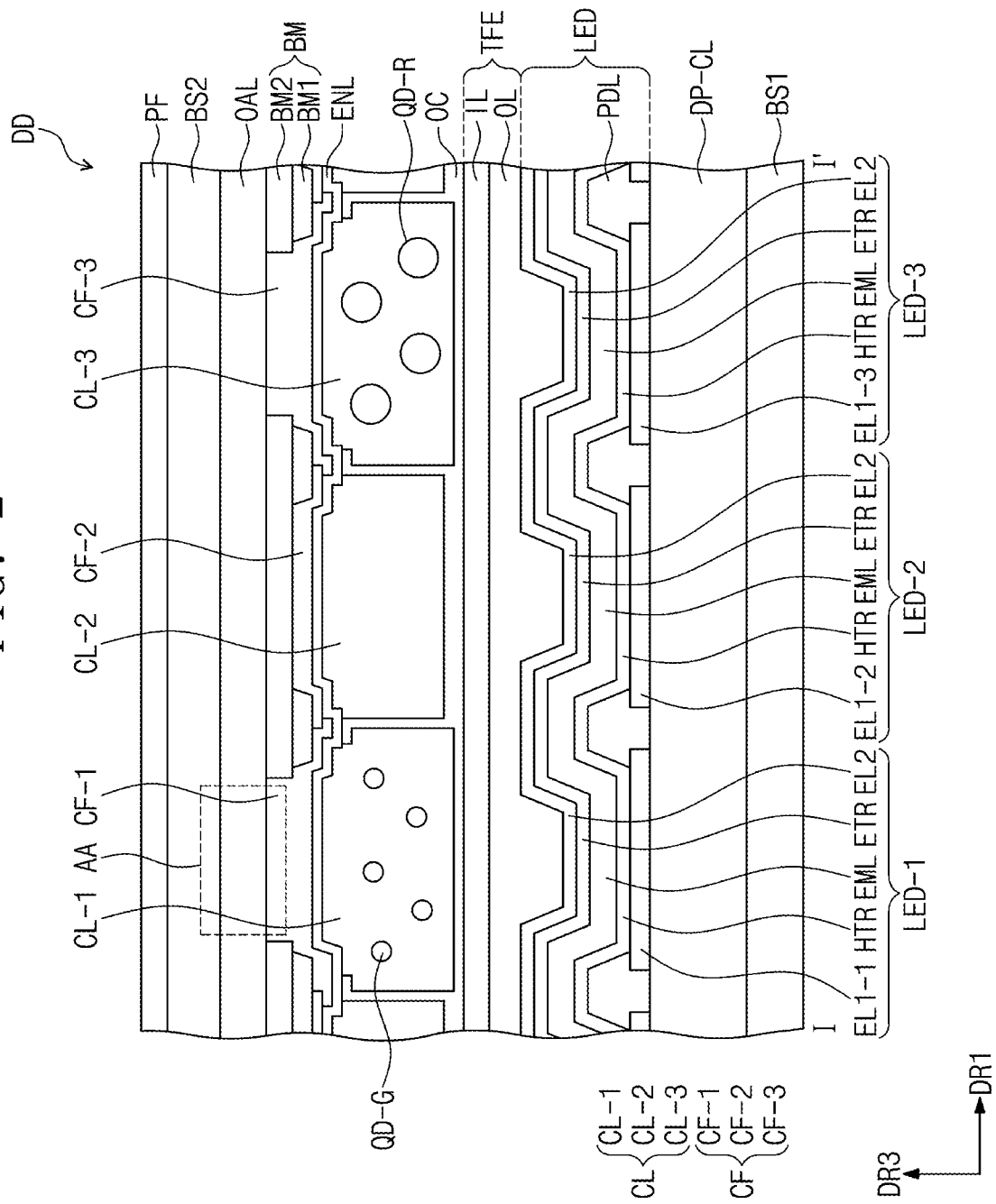
FIG. 2 is a schematic cross-sectional view taken along line I-I' of FIG. 1.
Figure 3:
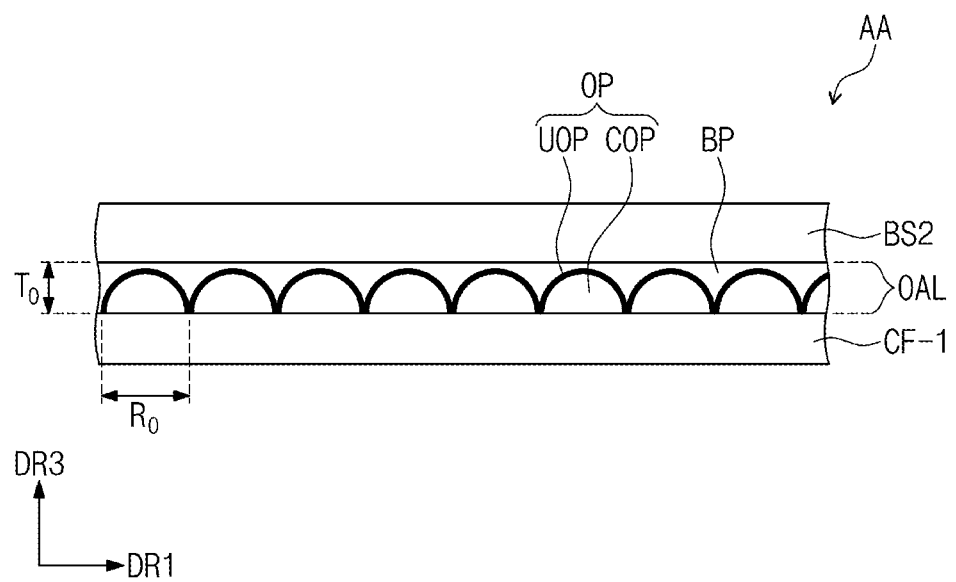
FIG. 3 is an enlarged view of a region AA of FIG. 2.
Figure 4:
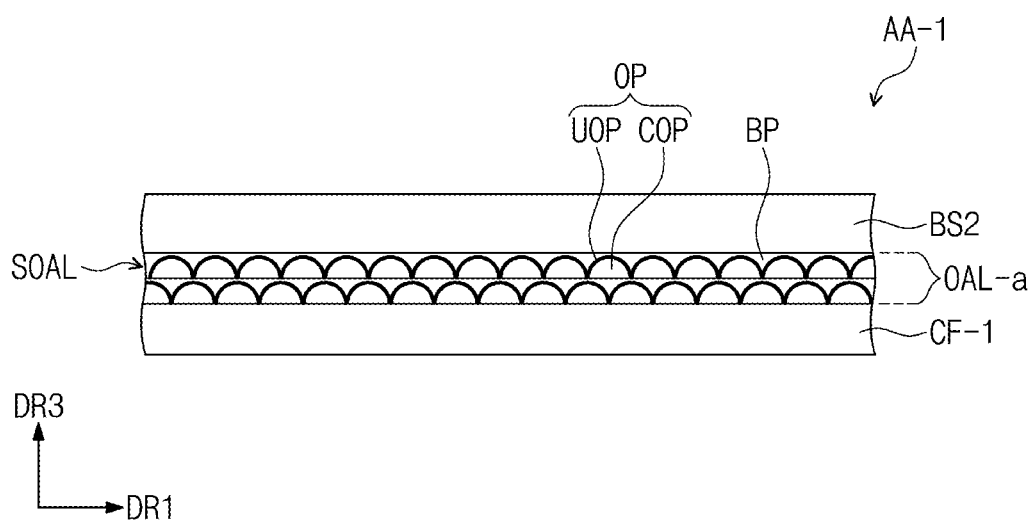
FIG. 4 is an enlarged view of a region AA of FIG. 2.
Figure 5:
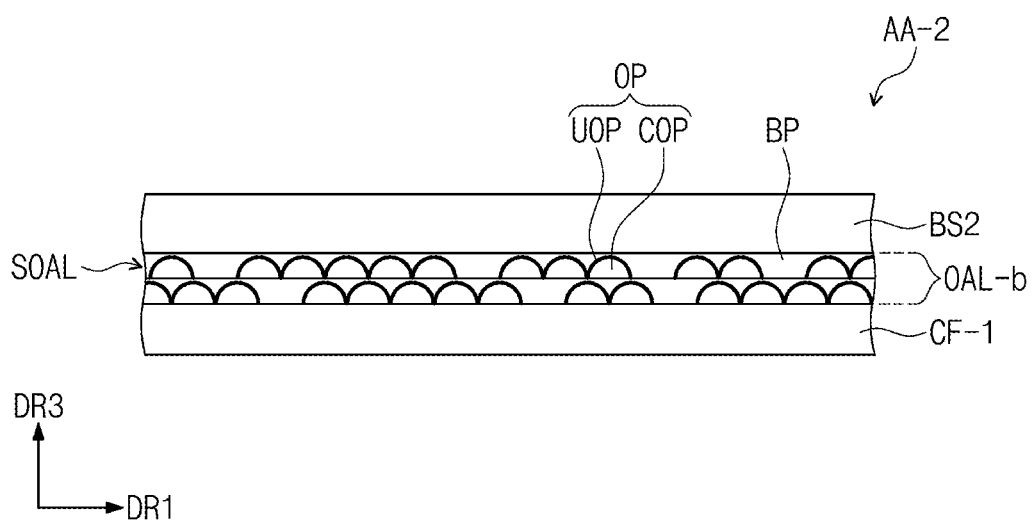
FIG. 5 is an enlarged view of a region AA of FIG. 2.

FIG. 1 shows a display device DD according to an exemplary embodiment. FIG. 2 shows an area corresponding to line I-I' of FIG. 1 and is a cross-sectional view of the display device DD of an exemplary embodiment. FIG. 3 is a cross-sectional view showing an area corresponding to a region AA of FIG. 2. Each of FIGS. 4 and 5 shows an area corresponding to the region AA of FIG. 2 and is a view illustrating another exemplary embodiment.

In FIG. 1, the display device DD is illustratively shown as a mobile electronic device. However, the display device DD may be used in small-to-medium scale electronic devices such as a personal computer, a laptop computer, a personal digital terminal, a vehicle navigation unit, a game console, a smart phone, a tablet, and a camera, as well as in large scale electronic devices such as a television, a monitor, and an outdoor advertising board. These are merely provided as exemplary embodiments, and the display device DD may be utilized in other electronic devices.

Referring to FIG. 1, the display device DD may display an image IM through a display surface IS. The display surface IS includes a display area DA, on which the image IM is displayed, and a non-display area NDA, which is adjacent to the display area DA and does not display an image.

The display area DA may have a tetragonal shape or a rectangular shape. The non-display area NDA may surround the display area DA. However, exemplary embodiments are not limited thereto, and the shape of the display area DA and the shape of the non-display area NDA may be relatively designed and varied. For example, the non-display area NDA may not be present on a front surface of the display device DD.

The display device DD may include a substrate BS2, a color filter layer CF disposed below the substrate BS2, a color control layer CL disposed below the color filter layer CF, and an optical auxiliary layer OAL disposed between the substrate BS2 and the color filter layer CF.

The optical auxiliary layer OAL may include a base portion BP and a plurality of recess portions OP defined in the base portion BP. The recess portions OP may be defined as portions around the base portion BP, which are not filled with a material for forming the base portion BP but a material for forming the color filter layer CF. The color filter layer CF may include pigment or dye, and thus, the recess portions OP defined in the base portion BP may include the pigment or dye that is used for forming the color filter layer CF.

Each of the recess portions OP has a shape recessed in a direction toward the substrate BS2, and a recessed surface of each of the recess portions OP may be adjacent to the substrate BS2.

According to an exemplary embodiment, an average refractive index of the optical auxiliary layer OAL may be greater than or equal to an average refractive index of the substrate BS2 and less than or equal to an average refractive index of the color filter layer CF. A refractive index of one region included in the optical auxiliary layer OAL may have a value close to that of the average refractive index of the substrate BS2. The one region of the optical auxiliary layer OAL may be a certain region included in the optical auxiliary layer OAL. For example, the one region of the optical auxiliary layer OAL may be a partial region included in the optical auxiliary layer OAL.

A refractive index of one region included in the optical auxiliary layer OAL may have a value close to that of the average refractive index of the color filter layer CF. Accordingly, the average refractive index of the optical auxiliary layer OAL may have a value between a value of the average refractive index of the substrate BS2 and a value of the average refractive index of the color filter layer CF. The optical auxiliary layer OAL will be described in detail in FIGS. 3, 4, and 5.

FIG. 2 shows an area corresponding to line I-I' of FIG. 1 and is a cross-sectional view of the display device DD of an exemplary embodiment.

The display device DD may include a base substrate BS1, a circuit layer DP-CL disposed on the base substrate BS1, a light emitting element layer LED disposed on the circuit layer DP-CL, and an encapsulation layer TFE disposed on the light emitting element layer LED.

The base substrate BS1 may be a polymer substrate, a plastic substrate, a glass substrate, or a quartz substrate. The base substrate BS1 may be a transparent insulating substrate. The base substrate BS1 may be rigid. The base substrate BS1 may be flexible.

The light emitting element layer LED may include first, second, and third light emitting elements LED-1, LED-2, and LED-3. The first, second, and third light emitting elements LED-1, LED-2, and LED-3 may include respective first electrodes EL1-1, EL1-2, and EL1-3, a hole transport area HTR, a light emitting layer EML, an electron transport area ETR, and a second electrode EL2, which are stacked in this order. The light emitting layer EML may generate a blue light. The light emitting element layer LED may emit a blue light, and the light emitting layer EML may generate light having a wavelength ranging from about 410 nm to about 480 nm. Here, each of a plurality of the light emitting elements may include a plurality of light emitting layers. The plurality of light emitting layers may be provided as being sequentially stacked, and the plurality of light emitting element including the plurality of light emitting layers may emit white color. The plurality of light emitting elements including the plurality of light emitting layers may have a tandem structure.

In the light emitting element layer LED, a pixel defining layer PDL may be defined. For example, the pixel defining layer PDL may include polyacrylate-based resin or polyimide-based resin. Alternatively, the pixel defining layer PDL may be made of an inorganic material. For example, the pixel defining layer PDL may include silicon nitride, silicon oxide, silicon oxynitride, or the like. In the light emitting element layer LED, the plurality of light emitting elements LED-1, LED-2, and LED-3 may be distinguished from each other by the pixel defining layer PDL.

The encapsulation layer TFE may be disposed on the light emitting element layer LED to seal the light emitting element layer LED. The encapsulation layer TFE may be for protecting the light emitting element layer LED against moisture/oxygen and protecting the light emitting element layer LED against impurities such as dust particles. FIG. 2 illustrates that the encapsulation layer TFE includes one organic layer OL and one inorganic layer IL, but exemplary embodiments are not limited thereto. The encapsulation layer may have a structure in which organic layers and inorganic layers are alternately stacked on each other.

The color control layer CL, the color filter layer CF, the optical auxiliary layer OAL, and the substrate BS2, which are described above, may be disposed on the encapsulation layer TFE. An overcoat layer OC may be disposed between the encapsulation layer TFE and the color control layer CL. The overcoat layer OC may be a planarization layer and a buffer layer.

The color control layer CL may include a plurality of quantum dots QD-G and QD-R and diffusing particles. The diffusing particles may be nanoparticles or the like including $TiO_2$ or silica. The diffusing particles may diffuse light provided from the light emitting element layer LED or light emitted from the quantum dots QD-G and QD-R. The quantum dots QD-G and QD-R may change a wavelength of the light emitted from the light emitting element layer LED.

The quantum dots QD-G and QD-R may be semiconductor nanocrystals which may be selected from a group II-VI compound, a group III-VI compound, a group III-V compound, a group IV-VI compound, a group IV element, a group IV compound, a group I-III-VI compound, and a combination thereof.

The group II-VI compound may be selected from the group consisting of: a binary element selected from the group consisting of CdSe, CdTe, CdS, ZnS, ZnSe, ZnTe, ZnO, HgS, HgSe, HgTe, MgSe, MgS, and a mixture thereof; a ternary element selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-VI compound may include a binary element compound such as $In_2S_3$ and $In_2Se_3$, a ternary element compound such as $InGaS_3$ and $InGaSe_3$, or any combination thereof.

The group compound may be selected from: a ternary element selected from the group consisting of $AgInS_2$, $CuInS_2$, $AgGaS_2$, $CuGaS_2$, and a mixture thereof; or a quaternary element such as $AgInGaS_2$ and $CuInGaS_2$.

The group III-V compound may be selected from the group consisting of: a binary element selected from the group consisting of GaN, GaP, GaAs, GaSb, AlN, AlP, AlAs, AlSb, InN, InP, InAs, InSb, and a mixture thereof; a ternary element selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary element selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. Here, the group III-V compound may further include group II metal. For example, InZnP or the like may be selected as the group III-II-V compound.

The IV-VI compound may be selected from the group consisting of: a binary element selected from the group consisting of SnS, SnSe, SnTe, PbS, PbSe, PbTe, and a mixture thereof; a ternary element selected from the group consisting of SnSeS, SnSeTe, SnSTe, PbSeS, PbSeTe, PbSTe, SnPbS, SnPbSe, SnPbTe, and a mixture thereof; and a quaternary element selected from the group consisting of SnPbSSe, SnPbSeTe, SnPbSTe, and a mixture thereof. The IV element may be selected from the group consisting of Si, Ge, and a mixture thereof. The IV compound may be a binary element selected from the group consisting of SiC, SiGe, and a mixture thereof.

Here, the binary element compound, the ternary element compound, and the quaternary element compound may exist inside a particle with a constant concentration, or may exist inside a same particle with divided into partially different states in concentration. Also, it is possible to have a core/shell structure in which one quantum dot surrounds another quantum dot. The interface between the core and shell may have a concentration gradient such that the concentration of elements present in the shell becomes gradually lower toward the center.

An example of shells of the quantum dots QD-G and QD-R may be a metal or non-metal oxide, a semiconductor compound, or a combination thereof.

For example, the example of the metal or non-metal oxide may be a binary element such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$ or a ternary element such as $MgAl_2O_4$, $CoFe_2O_4$, $NiFe_2O_4$, and $CoMn_2O_4$, but exemplary embodiments are not limited thereto.

The example of the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

A functional layer ENL may be disposed between the color control layer CL and the color filter layer CF. The functional layer ENL is disposed between the color control layer CL and the color filter layer CF and may allow a portion of the light emitted from the color control layer CL toward the color filter layer CF to be incident again to the color control layer CL. Through the recirculation of the light, the optical efficiency of the display device DD may be improved.

The color filter layer CF may include first, second, and third color filter portions CF-1, CF-2, and CF-3 and light blocking portions BM. The first, second, and third color filter portions CF-1, CF-2, and CF-3 may be disposed spaced apart from each other when viewed in a plane, and the light blocking portions BM may be disposed between the color filter portions CF-1, CF-2, and CF-3.

The first color filter portion CF-1 may be disposed to overlap a first color control portion CL-1 in a third direction DR3, and a first light may be transmitted therethrough. The second color filter portion CF-2 may be disposed to overlap a second color control portion CL-2 in the third direction DR3, and a second light may be transmitted therethrough. The third color filter portion CF-3 may be disposed to overlap a third color control portion CL-3 in the third direction DR3, and a third light may be transmitted therethrough. For example, the first light may be a green light, the second light may be a blue light, and the third light may be a red light. The first color filter portion CF-1 may transmit the green light and block the blue light and the red light. The second color filter portion CF-2 may transmit the blue light and block the green light and the red light. The third color filter portion CF-3 may transmit the red light and block the green light and the blue light.

Each of the light blocking portions BM may include a first light blocking pattern BM1 and a second light blocking pattern BM2. The light blocking portion BM may be formed of an organic light blocking material or an inorganic light blocking material including, e.g., black pigment or dye. The light blocking portion BM may be made of an organic light blocking material or an inorganic light blocking material including, e.g., blue pigment or dye. For example, the first light blocking pattern BM1 may be made of a light blocking material including, e.g., the black pigment or dye, and the second light blocking pattern BM2 may be made of a light blocking material including, e.g., the blue pigment or dye. The second light blocking pattern BM2 may include the same material as the second color filter portion CF-2 disposed below the second light blocking pattern BM2. However, exemplary embodiments are not limited thereto, and the second light blocking pattern BM2 may be omitted.

The substrate BS2 may be a polymer substrate, a plastic substrate, a glass substrate, or a quartz substrate. The substrate BS2 may be a transparent insulating substrate. The substrate BS2 may be rigid. The substrate BS2 may be flexible.

A protective film PF may be disposed on the substrate BS2. The protective film PF may have functions for protecting the display surface IS of the display device DD and preventing reflection due to the difference in refractive index between the substrate BS2 and air.

According to an exemplary embodiment, the optical auxiliary layer OAL may be disposed between the color filter layer CF and the substrate BS2.

The optical auxiliary layer OAL may include a base portion BP and a plurality of recess portions OP defined in the base portion BP. The recess portions OP may have a shape recessed in a direction toward the substrate BS2. The recessed surface of each of the recess portions OP may be adjacent to the substrate BS2. Each of the recess portions OP may include an outer portion UOP and a core portion COP. The outer portion UOP of each of the recess portions OP may be adjacent to the substrate BS2.

The outer portion UOP of each of the recess portions OP may include a polymer material. For example, the outer portion UOP of each of the recess portions OP may include polystyrene. However, this is merely an example, and exemplary embodiments are not limited thereto.

The core portion COP of each of the recess portions OP may be defined by the outer portion UOP of each of the recess portions OP, and may be filled with a material that is used for forming the color filter layer CF. The core portion COP of each of the recess portions OP may be filled with the same material as that contained in the color filter layer CF. The core portion COP of each of the recess portions OP may be filled with the same material as at least one of pigment and dye contained in the color filter layer CF. The core portion COP of each of the recess portions OP may be filled with the same material as at least one of the first color filter portion CF-1, the second color filter portion CF-2, the third color filter portion CF-3, and the light blocking portion BM, which are contained in the color filter layer CF. The core portion COP of each of the recess portions OP may be filled with the same material as at least one of the first, second, and third color filter portions CF-1, CF-2, and CF-3 and the light blocking portion BM, which are disposed adjacent to the core portion COP of each of the recess portions OP.

In FIGS. 3, 4, and 5, the core portion COP of each of the recess portions OP may include the same material as the first color filter portion CF-1 which is disposed adjacent to the core portion COP of each of the recess portions OP. The core portion COP of each of the recess portions OP may include the same material as pigment or dye that is used for forming the first color filter portion CF-1. For example, in a case where the first color filter portion CF-1 transmit the green light, the core portion COP of each of the recess portions OP may include the green pigment or dye. However, exemplary embodiments are not limited thereto, and the core portion COP of each of the recess portions OP may be filled with the same material as at least one of the second color filter portion CF-2, the third color filter portion CF-3, and the light blocking portion BM.

FIGS. 3, 4, and 5 illustrate that the recess portions OP have a hemispherical shape having a rounded surface and a flat surface, but exemplary embodiments are not limited thereto. The recess portions OP may have a shape in which only a portion of the rim that constitutes a circumference of a sphere is removed. For example, the recess portions OP may have a shape in which a portion less than half the entire circumference is removed from the circumference of sphere.

In FIG. 3, a diameter Ro of each of the recess portions OP is illustrated as being substantially parallel to a first direction DR1. According to an exemplary embodiment, an average diameter Ro of the recess portions OP may be about 200 nm to about 500 nm. The average diameter Ro of the recess portions OP may be about 200 nm to about 400 nm. The diameters of the recess portions OP may be different from each other. The diameter of recess portions OP having a non-spherical shape may be measured by being assumed to be a spherical shape having the same volume. In the descriptions, the average diameter Ro may represent an arithmetic mean value of nanoparticle diameters with respect to a plurality of nanoparticles. Alternatively, the average diameter Ro may represent a mean value of diameters with respect to one nanoparticle having a shape other than a sphere.

Each of the recess portions OP may be derived or formed from at least one of a hollow silica particle, a polymer having a cavity, and a porogen. For example, the recess portions OP may be derived or formed from the hollow silica particles. The outer portion UOP of each of the recess portions OP may be derived or formed from a shell of a hollow silica particle, and the core portion COP of each of the recess portions OP may be derived or formed from a core of the hollow silica particle. Alternatively, the outer portion UOP of each of the recess portions OP may be derived or formed from a polymer having a cavity, and the core portion COP of each of the recess portions OP may be derived or formed from the cavity surrounded by the polymer, which defines the outer portion of the polymer having the cavity.

The base portion BP of the optical auxiliary layer OAL may include at least one of acrylate resin, epoxy resin, and cardo resin. The difference between an average refractive index of the base portion BP and an average refractive index of the substrate BS2 may be about 0 to about 0.2. The difference between an average refractive index of the base portion BP and an average refractive index of the substrate BS2 may be about 0.1 or less. The refractive index of the base portion BP may be equal to the refractive index of the substrate BS2. The average refractive index of the substrate BS2 may be about 1.4 to about 1.5. The average refractive index of the base portion BP may be about 1.4 to about 1.6. For example, the refractive index of the substrate BS2 may be about 1.45, and the refractive index of the base portion BP may be about 1.55. The refractive index of the substrate BS2 may be about 1.45, and the refractive index of the base portion BP may be about 1.58. The refractive index of the substrate BS2 may be about 1.45, and the refractive index of the base portion BP may be about 1.53. However, this is merely an example, and exemplary embodiments are not limited thereto.

The average refractive index of the optical auxiliary layer OAL including the base portion BP and the recess portions OP may be greater than or equal to the average refractive index of the substrate BS2 and less than or equal to the average refractive index of the color filter layer CF. The average refractive index of the optical auxiliary layer OAL may have a value between the average refractive index of the substrate BS2 and the average refractive index of the color filter layer CF. The refractive index of the optical auxiliary layer OAL disposed between the substrate BS2 and the color filter layer CF may have a value close to the refractive index of the substrate BS2 in a region near the substrate BS2 and may have a value close to the refractive index of the color filter layer CF in a region near the color filter layer CF. As described above, the refractive index of the base portion BP may be close to the refractive index of the substrate BS2. Accordingly, the average refractive index of the optical auxiliary layer OAL may be greater than or equal to the average refractive index of the substrate BS2 and less than or equal to the average refractive index of the color filter layer CF.

According to an exemplary embodiment, a thickness TO of the optical auxiliary layer OAL may be about 500 nm to about 2000 nm. For example, the thickness TO of the optical auxiliary layer OAL may be a value close to half an average diameter RO of the recess portions OP. Here, in a case where each of optical auxiliary layers OAL-a and OAL-b includes a plurality of sub-optical auxiliary layers SOAL, the thickness of each of the optical auxiliary layers OAL-a and OAL-b may have a value close to the average diameter of the recess portions OP. However, this is merely an example, and exemplary embodiments are not limited thereto.

Unlike FIG. 3, a case where each of optical auxiliary layers OAL-a and OAL-b includes a plurality of sub-optical auxiliary layers SOAL is illustrated in FIGS. 4 and 5. Each of the optical auxiliary layers OAL-a and OAL-b may include a plurality of sub-optical auxiliary layers SOAL. Each of the sub-optical auxiliary layers SOAL may include a base portion BP and a plurality of recess portions OP defined in the base portion BP. The base portion BP and the recess portions OP included in each of the sub-optical auxiliary layers SOAL may be made of the same materials as those that are used for forming the base portion BP and the recess portions OP included in the optical auxiliary layer OAL.

The average diameter of the plurality of recess portions OP defined in the base portion BP of the sub-optical auxiliary layers SOAL of FIG. 4 may be less than the average diameter of the plurality of recess portions OP defined in the base portion BP of the optical auxiliary layer OAL of FIG. 3. Taking the average diameters RO of the recess portions OP into consideration, the optical auxiliary layers OAL, OAL-a, and OAL-b may be made in a single layer or a multi-layered structure. In a case where the average diameter of the recess portions OP is relatively small, each of the optical auxiliary layers OAL-a and OAL-b may have a multi-layered structure including the plurality of sub-optical auxiliary layers SOAL. In a case where the average diameter of the recess portions OP is relatively large, the optical auxiliary layer OAL may be made in a single layer.

FIGS. 3 and 4 illustrate that the recess portions OP are regularly disposed adjacent to each other. FIGS. 3 and 4 illustrate that the recess portions OP are disposed side by side in the first direction DR1. Unlike above, FIG. 5 illustrates that the recess portions OP may be spaced certain distances from each other. For example, the recess portions OP defined in the base portion BP may be not regularly arranged. For example, on the cross-section of the optical auxiliary layer OAL-b, the number of recess portions OP included in the same area may be different from each other.

Here, in the optical auxiliary layers OAL, OAL-a, and OAL-b of FIGS. 3, 4, and 5, the plurality of recess portions OP defined in the base portion BP are illustrated as being spaced a certain distance from the substrate BS2 in the third direction DR3. However, exemplary embodiments are not limited thereto, and the plurality of recess portions OP may not be spaced apart from the substrate but adjacent to the substrate.

Each of the optical auxiliary layers OAL, OAL-a, and OAL-b of an exemplary embodiment may include the base portion BP and the plurality of recess portions OP defined in the base portion BP. The average refractive index of each of the optical auxiliary layers OAL, OAL-a, and OAL-b may be greater than or equal to the average refractive index of the substrate BS2 and less than or equal to the average refractive index of the color filter layer CF. Each of the optical auxiliary layers OAL, OAL-a, and OAL-b disposed between the substrate BS2 and the color filter layer CF may reduce the reflectance of the display device DD due to the difference between the refractive index of the substrate BS2 and the refractive index of the color filter layer CF. Each of the optical auxiliary layers OAL, OAL-a, and OAL-b is disposed between the substrate BS2 and the color filter layer CF adjacent to the substrate BS2 and may reduce the difference in refractive index between the substrate BS2 and the color filter layer CF. The average refractive index of each of the optical auxiliary layers OAL, OAL-a, and OAL-b is greater than or equal to the average refractive index of the substrate BS2 and less than or equal to the average refractive index of the color filter layer CF. The optical auxiliary layers OAL, OAL-a, and OAL-b may reduce the difference in refractive index between the substrate BS2 and the color filter layer CF. Accordingly, the display device DD including the optical auxiliary layer OAL, OAL-a, or OAL-b of an exemplary embodiment may have the improved reflectance characteristics due to a specular component between the substrate BS2 and the color filter layer CF. For example, the specular component may include specular reflection or regular reflection such as the mirror-like reflection of light from a surface.

Hereinafter, a method of manufacturing a display device DD of an exemplary embodiment will be described, and the method includes forming an optical auxiliary layer OAL of an exemplary embodiment. The same reference symbols are given to the components described above, and duplicated descriptions thereof will be omitted for descriptive convenience.

Figure 6:
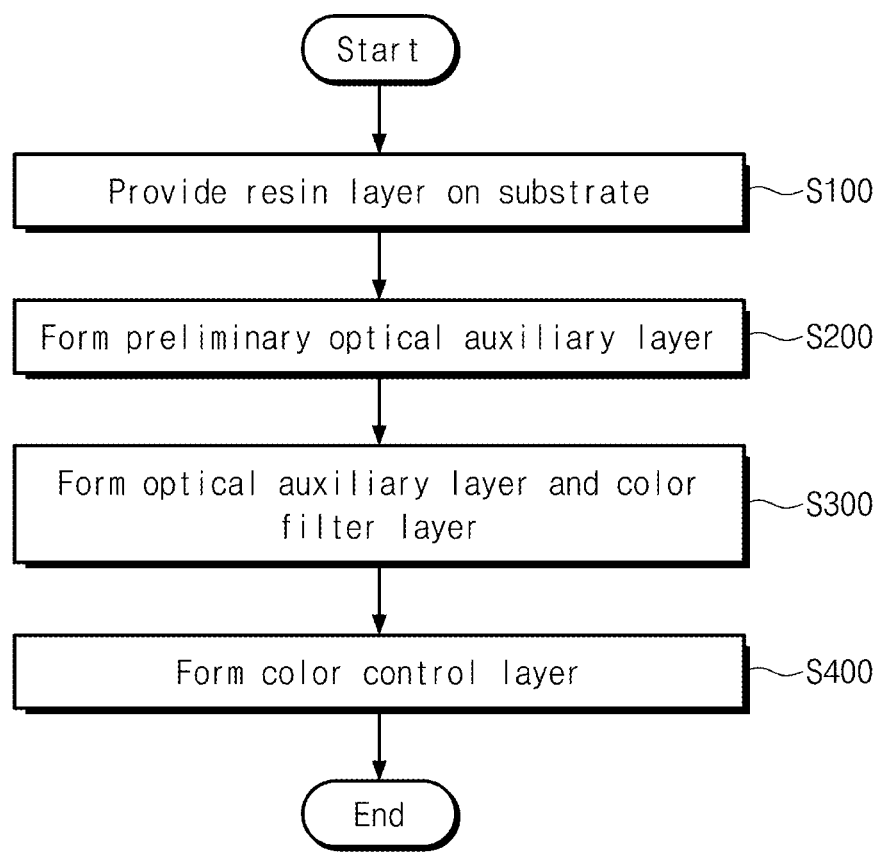
FIG. 6 is a schematic flowchart illustrating an exemplary embodiment of a method of manufacturing a display device according to the principles of the invention.

FIG. 6 is a schematic flowchart illustrating an exemplary embodiment of a method of manufacturing a display device DD according to the principles of the invention. Each of FIGS. 7 and 8 is a schematic view illustrating another example embodiment of a method of manufacturing a display device DD according to the principles of the invention.

The method of manufacturing the display device DD of an exemplary embodiment may include providing a resin layer BOP on a substrate BS (S100), forming a preliminary optical auxiliary layer OAL-P (S200), forming an optical auxiliary layer OAL and a color filter layer CF (S300), and forming a color control layer CL (S400).

Figure 7:
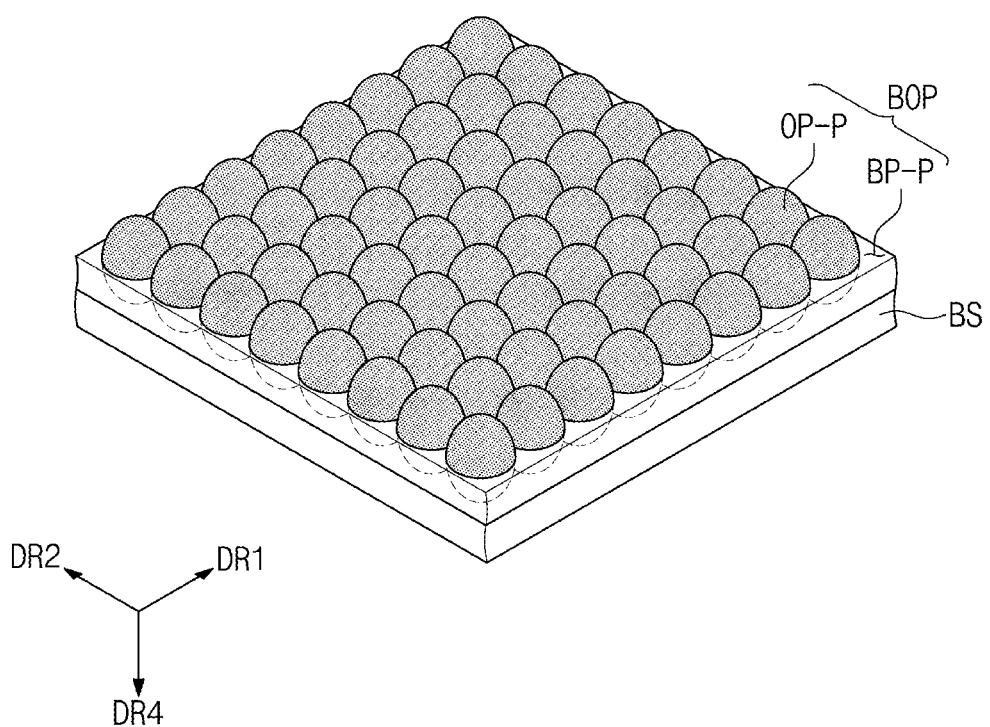
FIG. 7 is a schematic view illustrating another exemplary embodiment of a method of manufacturing a display device according to the principles of the invention.
Figure 8:
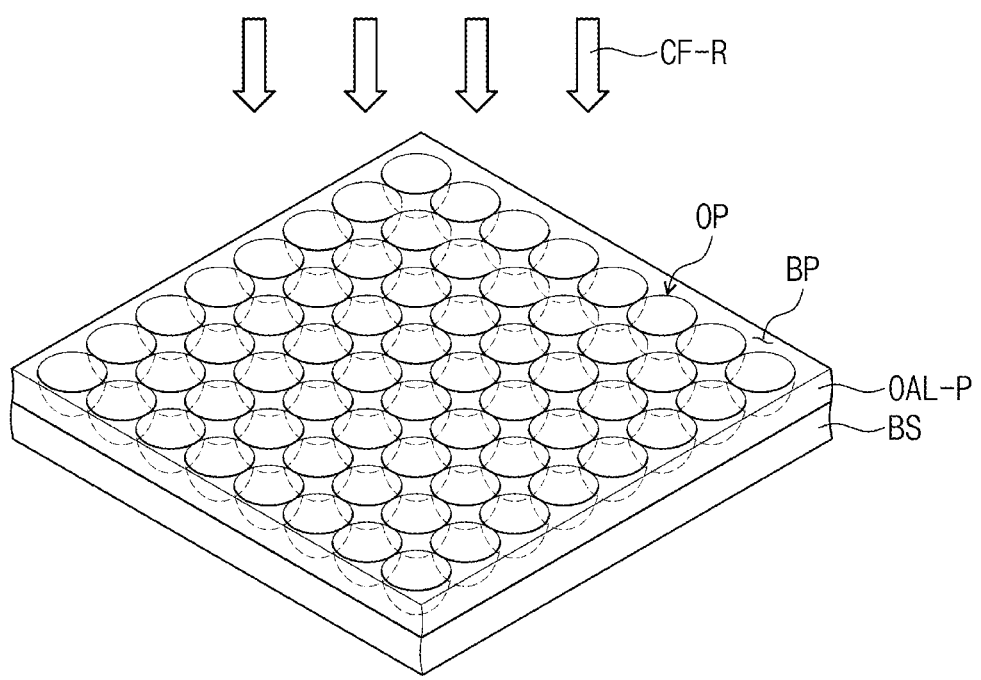
FIG. 8 is a schematic view illustrating another exemplary embodiment of a method of manufacturing a display device according to the principles of the invention.

FIG. 7 illustrates the step of providing (S100) of the resin layer BOP on the substrate BS. The substrate BS may be the same as the substrate BS described above (FIG. 2). The resin layer BOP provided on the substrate BS may include a base resin BP-P and a plurality of nanoparticles OP-P dispersed in the base resin BP-P. The base resin BP-P may include at least one of acrylate resin, epoxy resin, and cardo resin. The difference between a refractive index of the base resin BP-P and a refractive index of the substrate BS may be about 0 to about 0.2. The difference between the refractive index of the base resin BP-P and the refractive index of the substrate BS may be about 0.1 or less. The refractive index of the base resin BP-P may be equal to the refractive index of the substrate BS. The refractive index of the base resin BP-P may be greater than the refractive index of the substrate BS. The refractive index of the base resin BP-P may be about 1.4 to about 1.6. The refractive index of the substrate BS may be about 1.4 to about 1.5. The base portion BP described above may be formed from the base resin BP-P.

According to an exemplary embodiment, during the step of forming (S200) of the preliminary optical auxiliary layer OAL-P, the resin layer BOP may be etched to remove a portion of the nanoparticles OP-P. Each of the nanoparticles OP-P may have a spherical shape. An average diameter of the nanoparticles OP-P may be about 200 nm to about 500 nm. The average diameter of the nanoparticles OP-P may be about 200 nm to about 400 nm. FIGS. 7 and 8 illustrate that the nanoparticles OP-P have the same size, but exemplary embodiments are not limited thereto. The nanoparticles OP-P may have different sizes. For example, the nanoparticles OP-P may have different diameters. Also, the nanoparticles OP-P may have an elliptical shape or the like other than the spherical shape.

Each of the nanoparticles OP-P may be at least one of a hollow silica particle, a polymer having a cavity, and a porogen. For example, the nanoparticles OP-P may be porogens. In a case where the nanoparticles OP-P are the porogens, the nanoparticles OP-P may be contained in an amount of about 50 wt % to about 90 wt % with respect to a total weight of the base resin BP-P and the nanoparticles OP-P. For example, with respect to a total weight of the base resin BP-P and the porogens, the porogens may be contained in an amount of about 50 wt % to about 90 wt %. For example, when the total weight of the base resin BP-P and the porogens is about 100 weight, the weight of the porogens may be about 50 weight to about 90 weight.

Here, each of the nanoparticles OP-P may have a core-shell structure that includes a core and a shell surrounding the core. An outer portion UOP of each of recess portions OP may be derived from a shell of each of the nanoparticles OP-P, and a core portion COP of each of the recess portions OP may be derived from a core of each of the nanoparticles OP-P. The recess portions OP may be formed by etching the nanoparticles OP-P. An etchant may be provided on the resin layer BOP to remove a portion of the shells included in the nanoparticles OP-P. However, exemplary embodiments are not limited to the etchant provided on the resin layer BOP, and any solution having etching characteristics may be applied to the exemplary embodiments. An etching process of the resin layer BOP may be a dry etching process or a wet etching process, however, exemplary embodiments are not limited thereto.

Subsequently, a material CF-R for forming the color filter layer CF is provided on the preliminary optical auxiliary layer OAL-P having the recess portions OP formed therein, and thus, the optical auxiliary layer OAL may be formed. The material CF-R for forming the color filter layer CF may be the same as at least one of the first, second, and third color filter portions CF-1, CF-2, and CF-3 (FIG. 2) and the light blocking portion BM (FIG. 2), which are described above. The step of forming of the color filter layer CF may include providing (S300) of the material for forming the color filter layer CF on the preliminary optical auxiliary layer OAL-P. The step of forming (S300) of the optical auxiliary layer OAL and the color filter layer CF are performed in a continuous process, and the step of forming of the optical auxiliary layer OAL and the step of forming of the color filter layer CF may have the same process.

The method of manufacturing the display device DD may include the step of forming (S400) of the color control layer CL on the color filter layer CF. A material including the plurality of quantum dots QD-G and QD-R (FIG. 2) may be provided on the color filter layer CF to form the color control layer CL.

FIGS. 7 and 8 illustrate a case where the optical auxiliary layer OAL is formed in a single layer, but as described above, the optical auxiliary layers OAL-a and OAL-b (FIGS. 4 and 5) may be made in a multi-layered structure including the plurality of sub-optical auxiliary layers SOAL. For example, the preliminary optical auxiliary layer may include the plurality of preliminary sub-optical auxiliary layers. Each of the preliminary sub-optical auxiliary layers may include the base resin and the plurality of recess portions OP.

The method of manufacturing the display device DD of an exemplary embodiment may include the step of forming of the optical auxiliary layer OAL. The optical auxiliary layer OAL according to an exemplary embodiment may include the base portion BP and the plurality of recess portions OP defined in the base portion BP, and may be disposed between the substrate BS2 and the color filter layer CF. The optical auxiliary layer OAL disposed between the substrate BS2 and the color filter layer CF may contribute to improving the reflectance of the display device DD.

Hereinafter, a display device including an optical auxiliary layer according to an exemplary embodiment will be described in detail with reference to an exemplary embodiment and a comparative example. In addition, the following embodiment is only an illustration to assist the understanding of the inventive concept, and the scope of the inventive concept is not limited thereto.

Generally, when a light is reflected on a surface, the reflected light may include specular component (e.g., specular reflection or regular reflection) and diffuse component (e.g., diffuse reflection). In Table 1, "SCI" represents specular component included, and "SCE" represents specular component excluded. The specular component included (SCI) may be represented as a sum of the specular component (e.g., specular reflection) and the diffuse component (e.g., diffuse reflection). For example, the specular component excluded (SCE) may correspond to the diffuse component (e.g., diffused reflection) without the specular component (e.g., specular reflection). Further, in Table 1, "SCI-SCE" represents the specular component (e.g., specular reflection), in which the specular component excluded is removed from the specular component included.

The specular component excluded (SCE) represents a total sum of measured reflectance in specular component excluded, with respect to a layer including quantum dots and diffusing particles, a layer including pigment, and a layer including a protective film.

The specular component (e.g., specular reflection) represents a total sum of measured reflectance, with respect to reflection occurring on an interface between a substrate including glass and an air layer, reflection occurring on an interface between a substrate including glass and a color filter layer, and reflection occurring on an interface between a color filter portion and a light blocking portion.

TABLE 1

| Classification | Comparative example 1 | Embodiment 1 |
|---|---|---|
| SCI | 1.3% | 1.0% |
| SCE | 0.75% | 0.75% |
| SCI-SCE | 0.55% | 0.25% |

In Table 1, a display device of Embodiment 1 is a display device including the optical auxiliary layer of the illustrated exemplary embodiment, and a display device in Comparative example 1 is a display device without the optical auxiliary layer. The values in Comparative example 1 represent the reflectance in the display device without the optical auxiliary layer, and the values in Embodiment 1 represent the reflectance in the display device including the optical auxiliary layer.

Table 1 shows that the display device of Comparative example 1 and the display device of Embodiment 1 have the same reflectance (e.g., 0.75%) in the specular component excluded (SCE). Table 1 shows that the display device of Embodiment 1 has the lower reflectance (e.g., 1.0%) than that (e.g., 1.3%) of the display device of Comparative example in the specular component included (SCI) 1. Referring to FIG. 1, the specular component (e.g., specular reflection) in the display device of Embodiment 1 may be reduced by about 0.3% compared to in the display device of Comparative example 1. For example, as the specular component (e.g., specular reflection) is reduced in the display device of Embodiment 1, the total reflectance, which is represented as the sum of the specular component (e.g., specular reflection) and the diffuse component (e.g., diffuse reflection), may be reduced in Embodiment 1. Thus, the display device including the optical auxiliary layer of an exemplary embodiment may have the reduced the specular component (e.g., specular reflection) and have the improved total reflectance.

According to the exemplary embodiment, the optical auxiliary layer may include the base portion and the plurality of recess portions OP defined in the base portion and be provided between the substrate and the color filter layer disposed below the substrate. Also, the average refractive index of the optical auxiliary layer is greater than or equal to the average refractive index of the substrate and is less than or equal to the average refractive index of the color filter layer. The display device of the exemplary embodiment in which the optical auxiliary layer is disposed between the substrate and the color filter layer may have the improved reflectance between the substrate and the color filter layer.

The method of manufacturing the display device of the exemplary embodiment includes the step of forming of the optical auxiliary layer. The recess portions OP are formed by etching the plurality of nanoparticles, and the optical auxiliary layer may be formed by filling the recess portions OP with the color filter layer material. The optical auxiliary layer may be formed on the substrate, and the color filter layer may be formed on the optical auxiliary layer. Thus, the display device, manufactured through the manufacturing method of the display device of the exemplary embodiment, may have the improved reflectance between the substrate and the color filter layer.

The display device of the exemplary embodiment includes the optical auxiliary layer and may have the improved reflectance.

The method of manufacturing the display device of the exemplary embodiment includes the step of forming of the optical auxiliary layer and may provide the display device that have the improved reflectance.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate;
a color filter layer disposed below the substrate;
a color control layer disposed below the color filter layer; and
an optical auxiliary layer disposed between and in contact with both the substrate and the color filter layer and comprising a base portion and a plurality of recess portions, the plurality of recess portion defined in the base portion and recessed in a direction toward the substrate,
wherein an average refractive index of the optical auxiliary layer is greater than or equal to an average refractive index of the substrate and is less than or equal to an average refractive index of the color filter layer.

2. The display device of claim 1, wherein each of the recess portions comprises:
an outer portion; and
a core portion defined by the outer portion and filled with a same material as the color filter layer.

3. The display device of claim 2, wherein the core portion of each of the recess portions comprises pigment and/or dye included in the color filter layer.

4. The display device of claim 1, wherein each of the recess portions has a recessed round shape, and an average diameter of the recess portions is about 200 nm to about 500 nm.

5. The display device of claim 1, wherein each of the recess portions is formed from at least one of a hollow silica particle, a polymer having a cavity, or a porogen.

6. The display device of claim 1, wherein the color filter layer comprises:
a first color filter portion configured to transmit a first light;
a second color filter portion configured to transmit a second light different from the first light;
a third color filter portion configured to transmit a third light different from the first light and the second light; and
light blocking portions disposed between the first color filter portion and the second color filter portion and between the second color filter portion and the third color filter portion,
wherein each of the recess portions comprises a same material as at least one of the first color filter portion, the second color filter portion, the third color filter portion, or the light blocking portions.

7. The display device of claim 1, wherein the optical auxiliary layer comprises a plurality of sub-optical auxiliary layers, and each of the sub-optical auxiliary layers comprises the base portion and the recess portions.

8. The display device of claim 1, wherein the base portion comprises at least one of acrylate resin, epoxy resin, or cardo resin.

9. The display device of claim 1, wherein a difference between an average refractive index of the base portion and the average refractive index of the substrate is about 0 to about 0.2.

10. The display device of claim 9, wherein the average refractive index of the substrate is about 1.4 to about 1.5, and
the average refractive index of the base portion is about 1.4 to about 1.6.

11. The display device of claim 1, wherein a thickness of the optical auxiliary layer is about 500 nm to about 2000 nm.

12. A method of manufacturing a display device, the method comprising the steps of:
providing a resin layer on a substrate, the resin layer comprising a base resin and a plurality of nanoparticles dispersed in the base resin;
forming a preliminary optical auxiliary layer comprising recess portions formed by etching the resin layer to remove a portion of the nanoparticles;
forming a color filter layer by providing a color filter layer material on the preliminary optical auxiliary layer; and
forming a color control layer on the color filter layer, the color control layer comprising a plurality of quantum dots,
wherein the step of forming of the color filter layer comprises the step of forming an optical auxiliary layer by filling the recess portions with the color filter layer material.

13. The method of claim 12, wherein an average refractive index of the optical auxiliary layer is greater than or equal to an average refractive index of the substrate and is less than or equal to an average refractive index of the color filter layer.

14. The method of claim 12, wherein each of the nanoparticles is at least one of a hollow silica particle, a polymer having a cavity, or a porogen.

15. The method of claim 12, wherein the nanoparticles are a plurality of porogens, and
the porogens has an amount of about 50 wt % to about 90 wt % in a total weight of the base resin and the porogens.

16. The method of claim 12, wherein each of the nanoparticles has a spherical shape or an elliptical shape, and an average diameter of the nanoparticles is about 200 nm to about 500 nm.

17. The method of claim 12, wherein the preliminary optical auxiliary layer comprises a plurality of preliminary sub-optical auxiliary layers, and
each of the preliminary sub-optical auxiliary layers comprises the base resin and the recess portions.

18. The method of claim 12, wherein the base resin comprises at least one of acrylate resin, epoxy resin, or cardo resin.

19. The method of claim 12, wherein a difference between a refractive index of the base resin and a refractive index of the substrate is about 0 to about 0.2.

20. The method of claim 19, wherein the refractive index of the substrate is about 1.4 to about 1.5, and
the refractive index of the base resin is about 1.4 to about 1.6.

* * * * *